United States Patent [19]

Mozdzen

[11] Patent Number: 5,726,860
[45] Date of Patent: Mar. 10, 1998

[54] METHOD AND APPARATUS TO REDUCE CAVITY SIZE AND THE BONDWIRE LENGTH IN THREE TIER PGA PACKAGES BY INTERDIGITATING THE VCC/VSS

[75] Inventor: Thomas Mozdzen, Gilbert, Ariz.

[73] Assignee: Intel Corporation, Santa Clara, Calif.

[21] Appl. No.: 623,503

[22] Filed: Mar. 28, 1996

[51] Int. Cl.$^6$ ..................................................... H05K 1/14
[52] U.S. Cl. ........................... 361/761; 361/764; 361/777; 361/783; 361/820; 257/786; 257/691; 257/697; 257/725; 174/52.4; 174/52.1; 174/260
[58] Field of Search ....................................... 361/761, 764, 361/774, 775, 777, 780, 783, 820; 257/678, 691, 697, 700, 725, 786; 174/52.1, 52.4, 260; 433/68, 70, 525; 437/209; 333/246, 247; 439/68, 70, 525

[56] References Cited

U.S. PATENT DOCUMENTS 4,513,355  4/1985  Shroeder et al. ...................... 361/805
5,272,590  12/1993  Hernandez ............................. 361/306.2

Primary Examiner—Leo P. Picard
Assistant Examiner—David Foster
Attorney, Agent, or Firm—Blakely, Sokoloff, Taylor & Zafman

[57] ABSTRACT

A bus pattern for an integrated circuit package. The package has a first conductive bus and a second conductive bus that are located on a bond shelf. The first conductive bus has a plurality of interconnected tab portions that are separated by a plurality of non-conductive slots. The second conductive bus has a plurality of interconnected tab portions that are located within the non-conductive slots of the first bus. The tab portions of each bus are wire bonded to a plurality of die pads located on an integrated circuit that is mounted to the package.

11 Claims, 1 Drawing Sheet

METHOD AND APPARATUS TO REDUCE CAVITY SIZE AND THE BONDWIRE LENGTH IN THREE TIER PGA PACKAGES BY INTERDIGITATING THE VCC/VSS

BACKGROUND OF THE INVENTION

1. Field of the Invention

The present invention relates to an integrated circuit package.

2. Description of Related Art

FIG. 1 is a cross-sectional view of an integrated circuit package 2 of the prior art. The package 2 has bond shelves 4 that contain a number of bonding pads 6. The bonding pads 6 are coupled to the die pads 8 of an integrated circuit 10 mounted to the package. One of the bonding shelves 4 contains a pair of conductive busses 12 that are dedicated to electrical power (Vcc) and ground (Vss). The busses are coupled to die pads 8 that are also dedicated to Vcc and Vss. The conductive busses Vcc and Vss must be separated by an insulative space 14 to prevent shorting.

The package typically has a plurality of external pins or solder bumps (not shown) that are soldered to an external printed circuit board. When designing an integrated circuit package it is desirable to reduce, or at least maintain, the outer dimensions of the package to minimize the package footprint on the circuit board. Placing a larger integrated circuit within an existing package footprint requires a reduction in the width of the bond shelves to accommodate the additional die area. The reduction in bus width reduces the bond area of the busses. The smaller bond area may lower the manufacturing yield of the package. It would be desirable to provide a bus pattern that optimizes the bond area while providing a minimum bond shelf width.

Additionally, the dual bus design of prior art packages create relatively long bond wires between the die pad and the Vcc bus. It is generally desirable to provide short bond wires to prevent bond wire sag and to minimize the inductance of the wires. It would therefore be desirable to provide a bus pattern which minimizes the length of the bond wires that couple the die pads of the integrated circuit to the conductive busses of the package.

SUMMARY OF THE INVENTION

The present invention is a bus pattern for an integrated circuit package. The package has a first conductive bus and a second conductive bus that are located on a bond shelf. The first conductive bus has a plurality of interconnected tab portions that are separated by a plurality of non-conductive slots. The second conductive bus has a plurality of interconnected tab portions that are located within the non-conductive slots of the first bus. The tab portions of each bus are wire bonded to a plurality of die pads located on an integrated circuit that is mounted to the package.

BRIEF DESCRIPTION OF THE DRAWINGS

The objects and advantages of the present invention will become more readily apparent to those ordinarily skilled in the art after reviewing the following detailed description and accompanying drawings, wherein.

DETAILED DESCRIPTION OF THE INVENTION

Figure 1:
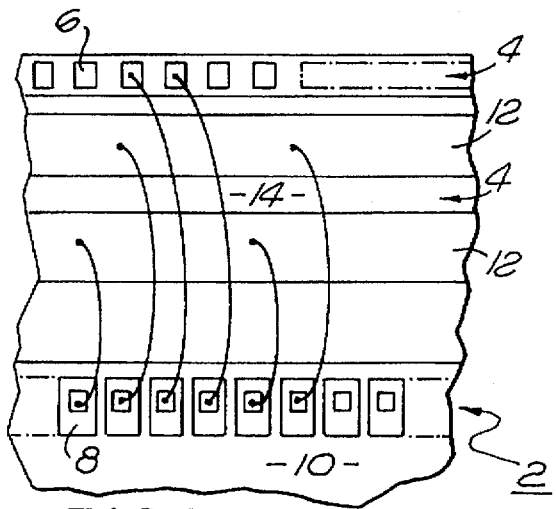
FIG. 1 is a top cross-sectional view of an integrated circuit package of the prior art.
Figure 4:
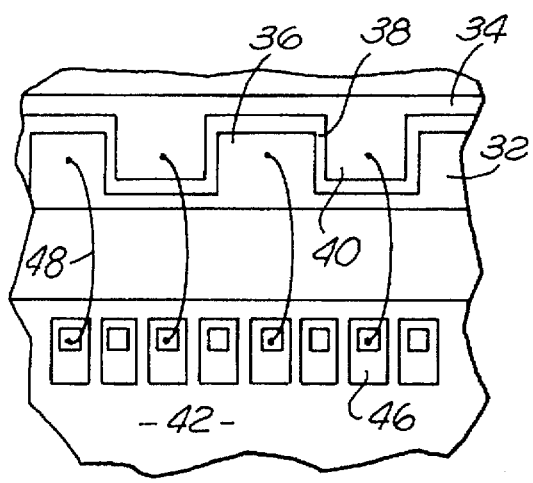
FIG. 4 is an enlarged top view of a pair of conductive busses of the integrated circuit package.
Figure 2:
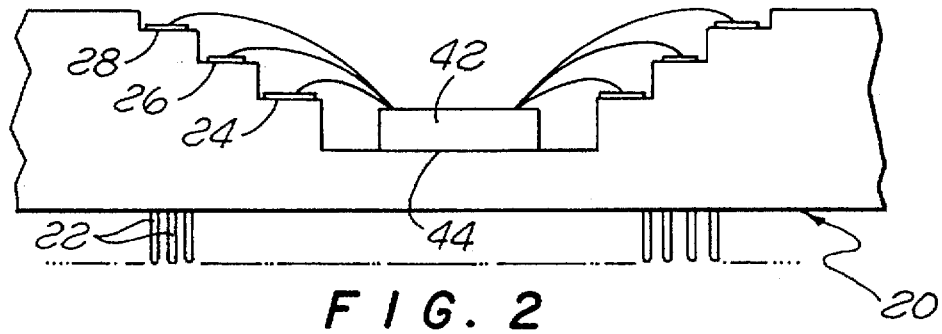
FIG. 2 is a side cross-sectional view of an integrated circuit package of the present invention.
Figure 3:
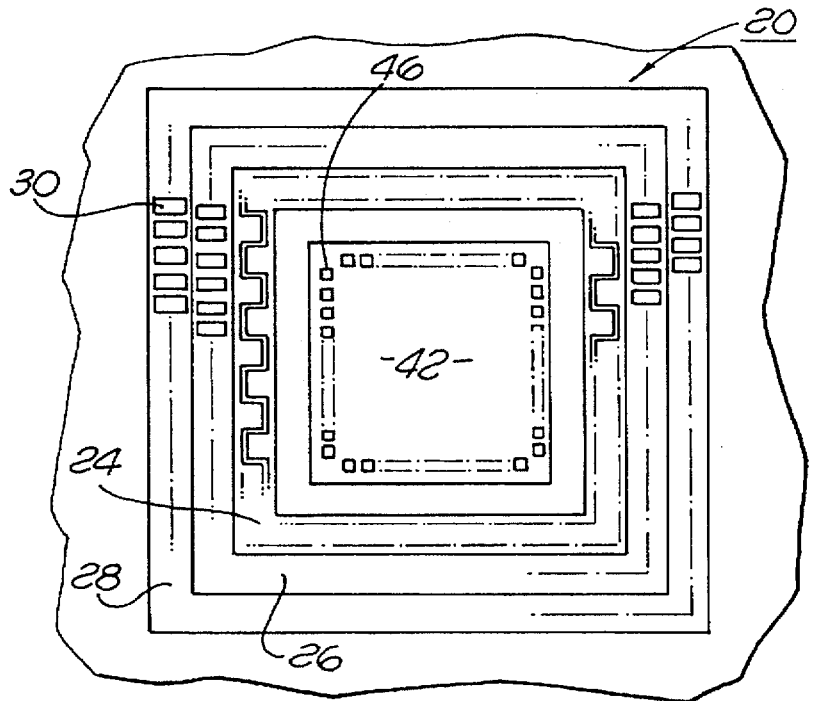
FIG. 3 is a top cross-sectional view of the integrated circuit package shown in FIG. 2.

Referring to the drawings more particularly by reference numbers, FIGS. 2–4 show an integrated circuit package 20 of the present invention. The package 20 may have a plurality of pins 22 that are soldered to an external printed circuit board (not shown). Although a pin grid array (PGA) package is shown and described, it is to be understood that the bus pattern of the present invention may be used in ball grid array (BGA) or land grid array (LGA) packages.

The package 20 has three bond shelves 24, 26 and 28 formed therein. Bond shelves 26 and 28 have a plurality of individual bond pads 30. Bond shelf 24 has a first conductive bus 32 and a second conductive bus 34. The first conductive bus 32 has a plurality of interconnected tab portions 36 that are separated by a number of non-conductive slots 38 in a sawtooth arrangement. The second conductive bus 34 has a plurality of interconnected tab portions 40 that are located within the slots 38 in an arrangement which mirrors the sawtooth pattern of the first bus 32. The bus pattern resembles the interlocking teeth of a pair of gears. The staggered sawtooth bus pattern extends in a rectangular pattern about the bond shelf 24. The first conductive bus 32 is typically dedicated to electrical ground (Vss). The second conductive bus 34 is typically dedicated to electrical power (Vcc).

An integrated circuit die 42 is mounted to a die mounting area 44 of the package 20. The integrated circuit 42 has a plurality of die pads 46 located about the periphery of the die 42. Some of the die pads 46 are dedicated to digital signals (SIGNAL). Some SIGNAL die pads are located adjacent to a die pad dedicated to electrical power Vcc and a die pad dedicated to electrical ground Vss in an alternating pattern.

The die pads 46 are coupled to the bond pads 30 and busses 32 and 34 by bond wires 48. Although bond wires 48 are shown and described, it is to be understood that the die can be coupled to the package by tape automated bonding (TAB) tape or other interconnect means. Locating the tab portions 40 of the second bus 34 within the slots 38 of the first bus 32 shortens the length of the bond wires 48 between the Vcc die pads and the bus 34. The thinner bus shelf also reduces the length of the bond wires to the other shelves. Minimizing the wire length reduces the self-inductance and other electrical noise within the package 20. The minimized bond wire length also reduces wire sagging. The staggered sawtooth bus pattern minimizes the width of the bond shelf 24 without reducing the bond area of the busses 32 and 34. The thinner bond area allows a larger integrated circuit die to be mounted to the package without increasing the outer dimensions of the package.

The busses 32 and 34, and bond pads 30 are routed to the pins 22 by internal routing within the package 20 to electrically couple the pins 22 to the integrated circuit 42. The package 20 can be constructed with conventional printed circuit board, or co-fired ceramic, processes. The busses 32 and 34 are typically formed by conventional plating and etching processes. Although rectangular shaped tab portions 36 and 40 of the busses are shown, it is to be understood that the tab portions may have other shapes such as triangular.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. An electronic package, comprising:

a package which has a bond shelf, a first conductive bus that is located on said bond shelf and which has a plurality of interconnected tab portions that are separated by a plurality of non-conductive slots, and a second conductive bus that is located on said bond shelf and which has a plurality of interconnected tab portions that are located within said non-conductive slots of said first conductive bus.

2. The package as recited in claim 1, wherein said first and second conductive busses are arranged in a rectangular pattern.

3. The package as recited in claim 2, wherein said tab portions are rectangular.

4. The package as recited in claim 1, wherein said first conductive bus is dedicated to electrical ground and said second conductive bus is dedicated to electrical power.

5. An integrated circuit package, comprising:

a package which has a die mount area, a bond shelf that extends around said die mount area, a first conductive bus that is located on said bond shelf and which has a plurality of interconnected tab portions that are separated by a plurality of non-conductive slots, and a second conductive bus that is located on said bond shelf and which has a plurality of interconnected tab portions that are located within said non-conductive slots of said first conductive bus;

an integrated circuit mounted to said die mount area, said integrated circuit having a plurality of die pads; and, a plurality of wire bonds that are attached to said die pads and said tab portions of said first and second conductive busses.

6. The package as recited in claim 5, wherein said die pad includes a signal die pad that is dedicated to an electrical signal, said signal die pad being located adjacent to a power die pad dedicated to electrical power and a ground die pad dedicated to electrical ground.

7. The package as recited in claim 5, wherein said first and second conductive busses are arranged in a rectangular pattern.

8. The package as recited in claim 7, wherein said tab portions are rectangular.

9. The package as recited in claim 8, wherein said first conductive bus is dedicated to electrical ground and said second conductive bus is dedicated to electrical power.

10. A method for assembling an electronic package, comprising:

a) providing a package which has a die mount area, a bond shelf that extends around said die mount area, a first conductive bus that is located on said bond shelf and which has a plurality of interconnected tab portions that are separated by a plurality of non-conductive slots, and a second conductive bus that is located on said bond shelf and which has a plurality of interconnected tab portions that are located within said non-conductive slots of said first conductive bus;

b) mounting an integrated circuit to said die mount area, wherein said integrated circuit has a plurality of die pads; and, c) coupling said die pads to said tab portions of said first and second conductive busses.

11. The method as recited in claim 10, wherein said die pads are coupled to said first and second conductive busses with bond wires.

* * * * *